(12) United States Patent
Kuge et al.

(10) Patent No.: US 9,296,080 B2
(45) Date of Patent: Mar. 29, 2016

(54) GLASS PLATE CONVEYING DEVICE AND BEVELING APPARATUS INCLUDING THE SAME

(75) Inventors: Morimasa Kuge, Kobe (JP); Hideyuki Tanaka, Kobe (JP); Keiji Tsujita, Kobe (JP); Kazunori Takahara, Kobe (JP)

(73) Assignee: KAWASAKI JUKOGYO KABUSHIKI KAISHA, Kobe-Shi (JP)

( * ) Notice: Subject to any disclaimer, the term of this patent is extended or adjusted under 35 U.S.C. 154(b) by 90 days.

(21) Appl. No.: 13/876,051

(22) PCT Filed: Mar. 24, 2011

(86) PCT No.: PCT/JP2011/001727
§ 371 (c)(1),
(2), (4) Date: Apr. 22, 2013

(87) PCT Pub. No.: WO2012/046360
PCT Pub. Date: Apr. 12, 2012

(65) Prior Publication Data
US 2013/0196576 A1    Aug. 1, 2013

(30) Foreign Application Priority Data
Oct. 6, 2010    (JP) .................................. 2010-226689

(51) Int. Cl.
*B24B 41/06*    (2012.01)
*B24B 9/10*    (2006.01)
(Continued)

(52) U.S. Cl.
CPC ................ *B24B 9/102* (2013.01); *B24B 9/107* (2013.01); *B24B 41/005* (2013.01); *B24B 41/06* (2013.01);
(Continued)

(58) Field of Classification Search
CPC ....... B24B 9/102; B65G 15/00; B65G 49/065
USPC .......... 451/184, 260, 7, 41, 44, 450; 198/493, 198/688.1, 689.1, 811
See application file for complete search history.

(56) References Cited

U.S. PATENT DOCUMENTS 3,800,477 A * 4/1974 Jendrisak et al. ............. 451/301
3,827,189 A * 8/1974 Highberg et al. ............. 451/121
(Continued)

FOREIGN PATENT DOCUMENTS

JP    A 53-71396    6/1978
JP    A 55-129753    10/1980
(Continued)

OTHER PUBLICATIONS

May 10, 2011 Search Report issued in International Patent Application No. PCT/JP2011/001727 (with translation).
(Continued)

*Primary Examiner* — Joseph J Hail
*Assistant Examiner* — Arman Milanian
(74) *Attorney, Agent, or Firm* — Oliff PLC

(57) ABSTRACT

The present invention provides a conveying device including a transfer mechanism including: a belt portion configured to support a non-pattern surface of a glass plate and transfer the glass plate in a conveying direction; and a pattern surface supporting water guide arranged at a position opposed to the belt portion and configured to apply predetermined water pressure to a pattern surface of the glass plate, wherein the transfer mechanism is configured such that: the glass plate is pressed against the belt portion by water pressure of the pattern surface supporting water guide; and the glass plate is sandwiched between the pattern surface supporting water guide and the belt portion in a state where the pattern surface of the glass plate is in a non-contact state, the conveying device being capable of stably transferring the glass plate without making scratches on the pattern surface of the glass plate.

19 Claims, 8 Drawing Sheets

(51) Int. Cl.
  *B65G 15/00* (2006.01)
  *B65G 49/06* (2006.01)
  *H01L 21/677* (2006.01)
  *B24B 41/00* (2006.01)

(52) U.S. Cl.
  CPC .............. *B65G 15/00* (2013.01); *B65G 49/065* (2013.01); *H01L 21/67706* (2013.01); *B65G 2249/045* (2013.01)

(56) References Cited

U.S. PATENT DOCUMENTS

| | | | |
|---|---|---|---|
| 3,932,962 A * | 1/1976 | Devillers | 451/6 |
| 4,228,617 A * | 10/1980 | Bando | 451/5 |
| 4,658,550 A * | 4/1987 | Myers et al. | 451/5 |
| 4,667,443 A * | 5/1987 | Sakurai et al. | 451/236 |
| 4,908,996 A * | 3/1990 | Friedman et al. | 451/43 |
| 5,993,295 A * | 11/1999 | Raffaelli | 451/43 |
| 6,203,409 B1 * | 3/2001 | Kennedy et al. | 451/43 |
| 6,220,056 B1 * | 4/2001 | Ostendarp | B65G 49/065 406/88 |
| 6,416,382 B1 * | 7/2002 | Bavelloni | 451/5 |
| 6,428,390 B1 * | 8/2002 | Clark | B24B 7/06 451/11 |
| 7,235,002 B1 * | 6/2007 | Pride | 451/43 |
| 2002/0037686 A1 * | 3/2002 | Brown et al. | 451/42 |
| 2005/0129469 A1 * | 6/2005 | Ikehata et al. | 406/52 |

FOREIGN PATENT DOCUMENTS

| | | |
|---|---|---|
| JP | A 6-126583 | 5/1994 |
| JP | A 2001-151318 | 6/2001 |
| JP | A 2003-63643 | 3/2003 |
| JP | A 2003-341828 | 12/2003 |
| JP | A 2004-154893 | 6/2004 |

OTHER PUBLICATIONS

Sep. 18, 2013 Search Report issued in Taiwanese Patent Application No. 100110515 (with translation).

* cited by examiner

GLASS PLATE CONVEYING DEVICE AND BEVELING APPARATUS INCLUDING THE SAME

TECHNICAL FIELD

The present invention relates to a conveying device configured to convey a glass plate in a horizontal state, the glass plate being used in a liquid crystal display glass substrate, a plasma display panel, or the like.

BACKGROUND ART

Conventionally, a glass plate (in the present description and claims, the "glass plate" denotes, for example, a glass plate used in a flat panel display (FPD), such as a liquid crystal panel, a plasma panel, or an organic EL panel) used in a liquid crystal display or the like is produced from a glass plate (mother glass) having such a size that a plurality of glass plates each having a predetermined size can be produced.

To protect the surface of the glass plate from cullet generated during process steps, particles generated as a result of processes, or the like, a method of attaching a protective sheet to the surface of the glass plate is generally adopted. The thickness of such a glass plate is about 0.7 mm.

The glass plate is conveyed in a lateral state, that is, a horizontal state and cut to have a predetermined size by a plurality of process steps. Then, cut end edges of the glass plate are subjected to beveling, such as grinding or polishing. With this, a glass plate product having a predetermined strength is produced.

One prior art for conveying this type of glass plate is that: a plate member is sandwiched between a lower endless belt and an upper endless belt in an end surface processing machine; a lower surface of a lower moving portion of the upper endless belt is pressed against an upper surface of an upper moving portion of the lower endless belt; and the upper endless belt and the lower endless belt are moved at the same speed (see PTL 1, for example).

Another prior art is that a glass plate is sandwiched and transferred by endless conveyor belts (see PTL 2, for example). Yet another prior art is that glass plate sandwiching members are provided at upper and lower opposing surfaces of two pairs of upper and lower endless rotating chains, and a glass plate is sandwiched and transferred by the glass plate sandwiching members (see PTL 3, for example).

CITATION LIST

Patent Literature

PTL 1: Japanese Laid-Open Patent Application Publication No. 6-126583
PTL 2: Japanese Laid-Open Patent Application Publication No. 53-71396
PTL 3: Japanese Laid-Open Patent Application Publication No. 55-129753

SUMMARY OF INVENTION

Technical Problem

Here, the surface of the above-described glass plate used in, for example, the flat panel display is required to have high quality regarding beauty, that is, to have no scratches or dirt. In addition, the glass plate is also required to have high quality regarding surface accuracy, that is, to be flat without being warped or waved.

Especially, regarding a pattern surface (in the present description and claims, a surface on which various thin film layers, such as a semiconductor layer, are formed) of this type of glass plate, for example, in the case of a liquid crystal display using TFTs (thin film transistors), various thin film layers, such as an amorphous silicon layer, an insulating layer, and a semiconductor layer, are formed on a thin alkali-free glass substrate; and patterning is performed. Thus, the TFTs and display electrodes and wires for driving the liquid crystal are formed. Therefore, the pattern surface of the glass plate is required to have, for example, extremely high cleanliness as compared to a back surface (in the present description and claims, a non-pattern surface) of the glass plate.

However, in PTLs 1 to 3, the glass plate is transferred in a state where the lower surface and upper surface of the glass plate are sandwiched between the belts. Therefore, if dust and the like are sandwiched between the pattern surface of the glass plate and the belt, scratches are made on the pattern surface even in a case where the protective sheet is being attached to the surface of the glass plate as described above.

Especially, in a step of grinding an end edge of the glass plate while transferring the glass plate, there is a high possibility that grinding powder and the like are sandwiched between the pattern surface of the glass plate and the belt, and this makes scratches on the pattern surface. If scratches are made on the pattern surface, the glass plate needs to be disposed of. This deteriorates the yield, and therefore, the productivity decreases.

Solution to Problem

Here, an object of the present invention is to provide a glass plate conveying device capable of stably transferring a glass plate without making scratches on a pattern surface of the glass plate.

To achieve the above object, a glass plate conveying device according to the present invention is a conveying device configured to transfer a glass plate in a horizontal state, the glass plate conveying device including a transfer mechanism including: a belt portion configured to support a non-pattern surface of the glass plate and transfer the glass plate in a conveying direction; and a fluid guide arranged at a position opposed to the belt portion and configured to apply predetermined fluid pressure to a pattern surface of the glass plate, wherein the transfer mechanism is configured such that: the glass plate is pressed against the belt portion by fluid pressure of the fluid guide; and the glass plate is sandwiched between the fluid guide and the belt portion in a state where the pattern surface of the glass plate is in a non-contact state. In the present description and claims, the "fluid" denotes a liquid, air, or the like, such as "pure water", by which high cleanliness of the surface of the glass plate can be maintained. With this configuration, without causing the belt and the like to contact the pattern surface of the glass plate, the glass plate can be conveyed in a state where the glass plate is sandwiched between the belt portion and the fluid guide. Therefore, without making scratches on the pattern surface of the glass plate, the glass plate can be stably conveyed while maintaining the high quality of the surface of the glass plate.

The transfer mechanism may be provided at a width-direction middle portion of the glass plate, and fluid guides each configured to form a fluid layer between the surface of the glass plate and the fluid guide and support the glass plate in a non-contact manner may be respectively arranged at both end portions of the glass plate. In the present description and claims, the "width direction of the glass plate" denotes a direction perpendicular to the conveying direction of the glass plate conveyed in the horizontal state. With this, by providing the transfer mechanism only at the width-direction middle portion of the glass plate, the cost of the conveying device can also be reduced.

The glass plate may be conveyed in a state where the pattern surface of the glass plate faces upward. With this, the contact state between the belt portion and the glass plate is maintained by the pressing force generated by the fluid pressure applied from the fluid guide and the weight of the glass plate itself. Thus, the glass plate can be stably conveyed by the belt portion in a state where the pattern surface of the glass plate is in a non-contact state.

A glass plate beveling apparatus according to the present invention includes: any one of the above conveying devices; a beveling device configured to grind and polish an end edge of the glass plate conveyed by the conveying device; and a guide portion configured to guide the belt portion in the conveying direction. With this configuration, while conveying the glass plate in a state where the pattern surface of the glass plate is in a non-contact state, the end edge (edge portion) of the glass plate can be accurately grinded and polished. Thus, the deterioration of the yield by the formation of scratches on the pattern surface can be suppressed.

The beveling device may include grinding stone portions provided so as to respectively bevel both transferring-direction side portions of the glass plate. With this, two sides of both end edges of the glass plate conveyed by the conveying device can be grinded and polished by the grinding stone portions at the same time.

The beveling device may include a corner beveling device configured to grind and polish a corner portion of the glass plate. In the present description and claims, the "corner portion" denotes each of four corners of the square glass plate. With this, the operation of beveling the corner portions of the glass plate can be continuously performed by including this operation in the operation of beveling the end edges of the four sides of the glass plate. Each of the corner portions may be beveled in a liner or curved shape.

The corner beveling device may include a grinding stone portion including a grinding stone and a polishing stone, and the grinding stone portion may include an arrangement changing mechanism configured to cause the grinding stone or the polishing stone to be located at the end edge of the glass plate. With this, the corner portion of the glass plate conveyed by the conveying device can be grinded and polished by the corner beveling device. Thus, the corner portion of the glass plate can be finished with a high degree of accuracy.

Two beveling apparatuses may be arranged in the conveying direction of the glass plate, and a rotating machine configured to rotate the glass plate by 90 degrees in a horizontal plane may be arranged between the two beveling apparatuses. In this case, after the end edges of two sides of the glass plate are beveled by the beveling apparatus provided on an upstream side in the conveying direction, the rotating machine rotates the glass plate by 90 degrees in a horizontal plane. After that, the end edges of the remaining two sides of the glass plate are beveled by the beveling apparatus provided on a downstream side. Thus, the four sides of the glass plate can be continuously beveled. That is, the cycle time of the beveling operation can be shortened.

The glass plate beveling apparatus may include: a long side beveling apparatus; and a short side beveling apparatus, wherein: the long side beveling apparatus includes a grinding stone portion including a round-beveling grinding stone and a polishing stone; and the short side beveling apparatus includes a grinding stone portion including a round-beveling grinding stone, a polishing stone, and a corner beveling stone. In the present description and claims, the "round beveling" denotes an operation of beveling the glass plate in a semicircular shape such that the middle portion of the thickness cross section of the glass plate projects. With this, the two short-side end edges and corners of the glass plate are beveled by the short side beveling apparatus whose glass plate transfer time is short. Therefore, the difference between the transfer speed of the glass plate in the long side beveling apparatus and the transfer speed of the glass plate in the short side beveling apparatus can be reduced. Thus, the beveling operation can be continuously, efficiently performed.

Advantageous Effects of Invention

According to the present invention, since the glass plate can be conveyed while supporting the glass plate by the fluid pressure in a state where the pattern surface is in a non-contact state, the glass plate can be conveyed in good yield while maintaining the high quality of the surface of the glass plate. Thus, the productivity can be improved.

DESCRIPTION OF EMBODIMENTS

Hereinafter, embodiments of the present invention will be explained based on the drawings. In the embodiments below, a beveling apparatus configured to bevel end edges 5 of a glass plate 1 while conveying the glass plate 1 will be explained. Each of the embodiments below will explain an example in which a transfer mechanism 40 is provided at a conveying-direction middle portion of the glass plate 1, and the glass plate 1 is conveyed in a state where a pattern surface 2 of the glass plate 1 faces upward. In addition, an explanation will be made by taking a water guide as an example of a fluid guide. The thickness and the like of the glass plate 1 are exaggeratingly shown for convenience sake.

Figure 1:
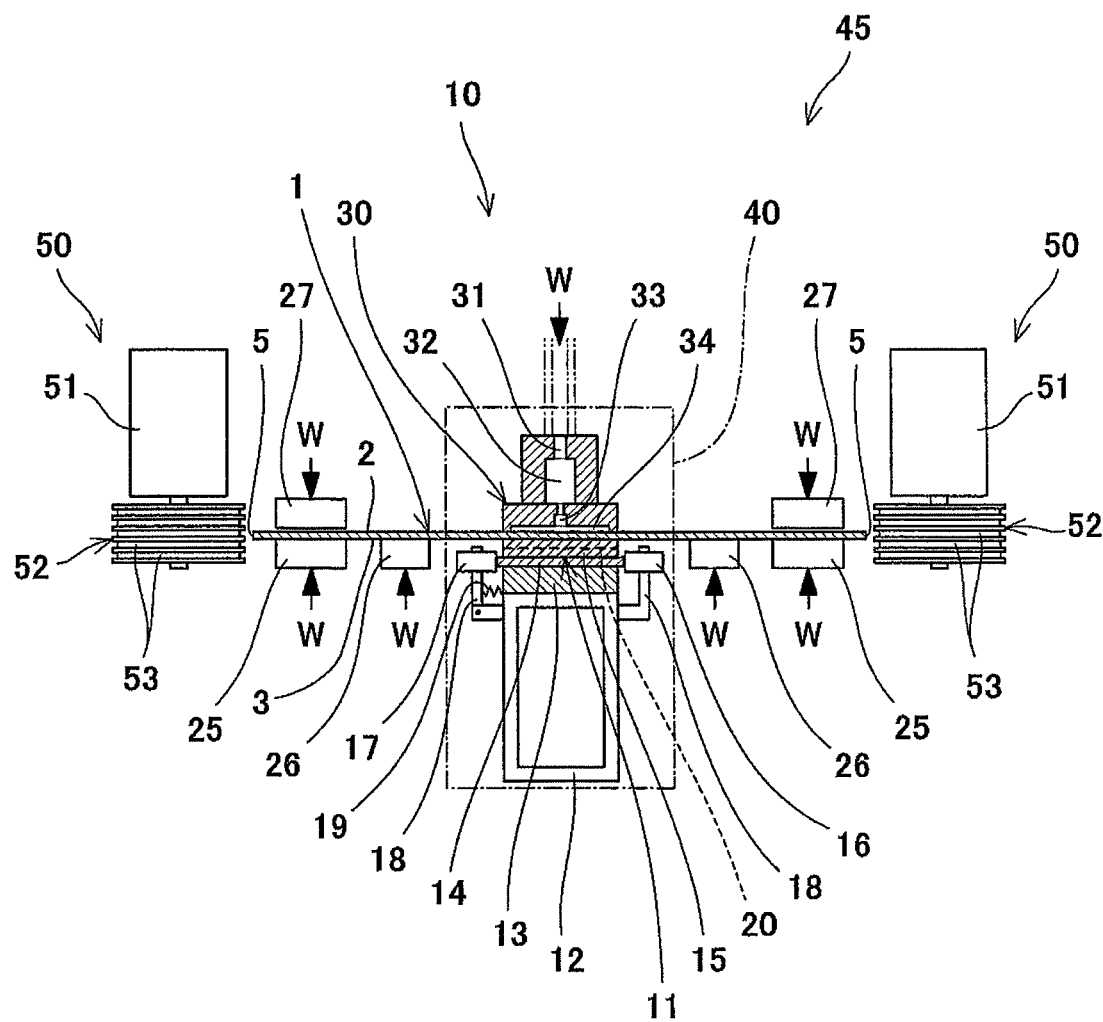
FIG. 1 is a cross-sectional view showing a beveling apparatus according to Embodiment 1 of the present invention, the cross-sectional view being perpendicular to a conveying direction, the beveling apparatus including a conveying device.

As shown in FIG. 1, as a conveying device 10, a belt portion 11 configured to support a lower surface of the glass plate 1 is provided at a width-direction middle portion. The belt portion 11 is configured such that a metal belt 14 (for example, a stainless steel belt) moves on a belt receiving portion 13 provided at an upper portion of a rectangular frame 12. A rubber plate 15 is attached to an outer peripheral surface of the metal belt 14. The rubber plate 15 is provided integrally with an outer periphery of the metal belt 14. With this, the position of glass plate 1 can be accurately controlled in the conveying direction by the metal belt 14, and the rubber plate 15 softly contacts the glass plate 1.

The straightness of the glass plate 1 in the conveying direction by the belt portion 11 is maintained by maintaining the straightness of the metal belt 14 in the conveying direction. A conveying-direction straightness deviation of the metal belt 14 is maintained in such a manner that side rollers 16 and 17 (guide portions) provided at the frame 12 guide the metal belt 14 to regulate the width-direction movement of the metal belt 14. The side rollers 16 and 17 are respectively, rotatably supported by upper portions of support brackets 18 provided at the frame 12.

In the example shown in FIG. 1, the side roller 16 on the right side is a base side roller 16 that is a base guide portion. The side roller 17 on the opposite side is pressed against the metal belt 14 by a predetermined pressing force since the support bracket 18 is pulled toward the frame 12 by a spring 19 provided at the frame 12. With this, the metal belt 14 is guided by the base side roller 16 to move at an accurate position. Thus, the width-direction movement of the belt portion 11 is regulated.

The metal belt 14 is driven by driving pulleys (not shown) provided at an end portion thereof. The driving pulley is driven by a servo motor, and the speed and position thereof are controlled. With this, even in the case of conveying a plurality of glass plates 1 at the same time, the glass plates 1 do not become unstable.

Figure 2:
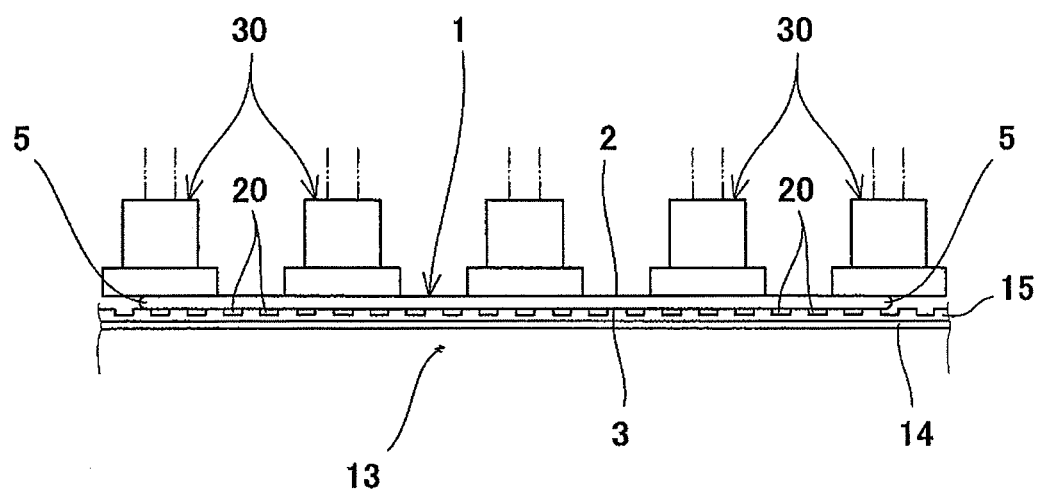
FIG. 2 is an enlarged side view showing a belt portion shown in FIG. 1 in the conveying direction.

As shown in FIG. 2, a surface of the rubber plate 15 of the belt portion 11 is formed to have concavo-convex portions. On the surface of the rubber plate 15 of the present embodiment, grooves 20 each extending in a direction intersecting with the conveying direction are provided at regular intervals in the conveying direction. Thus, the concavo-convex portions are formed. Water between the rubber plate 15 and the glass plate 1 is discharged through the grooves 20, and the frictional resistance between the rubber plate 15 and the glass plate 1 is maintained by the convex portions. Each of the size, shape, arrangement pitch, and the like of the groove 20 is just one example and may be changed. Instead of the grooves 20, for example, concave portions capable of preventing the frictional resistance from decreasing by water between the rubber plate 15 and the glass plate 1 may be adopted.

As shown in FIG. 1, the width-direction middle portion of the glass plate 1 is supported by the belt portion 11, and in addition, portions of a non-pattern surface 3 other than the middle portion are supported by width-direction both end portion water guides 25 and width-direction intermediate portion water guides 26. The width-direction intermediate portion water guides 26 support the glass plate 1 in a non-contact manner and prevents deformation caused by deflection. The width-direction intermediate portion water guides 26 are arranged depending on the size of the glass plate 1 according to need.

A water film is formed by supplying water W to a portion between the lower surface of the glass plate and each of upper surfaces of the width-direction both end portion water guides 25 and width-direction intermediate portion water guides 26. With this, the glass plate 1 is supported by each of the width-direction both end portion water guides 25 and the width-direction intermediate portion water guides 26 from below via this water film.

Width-direction both end portion water guides 27 are provided so as to be respectively opposed to the width-direction both end portion water guides 25 with the glass plate 1 sandwiched between the guides 25 and 27. The width-direction both end portion water guides 27 are arranged so as to be slightly spaced apart from the upper surface of the glass plate 1. The water W is supplied from the width-direction both end portion water guide 27 to the space between the glass plate 1 and the width-direction both end portion water guide 27. By this water, a water film is formed between the width-direction both end portion water guide 27 and the glass plate 1. Thus, the width-direction both end portion water guide 27 supports the glass plate 1 in the non-contact manner via the water film together with the width-direction both end portion water guide 25.

A pattern surface supporting water guide 30 is provided above the width-direction middle portion of the glass plate 1 so as to be opposed to the belt portion 11. The pattern surface supporting water guide 30 is arranged so as to be slightly spaced apart from the upper surface of the glass plate 1. The pattern surface supporting water guide 30 is provided so as not to contact the glass plate 1.

Figure 3:
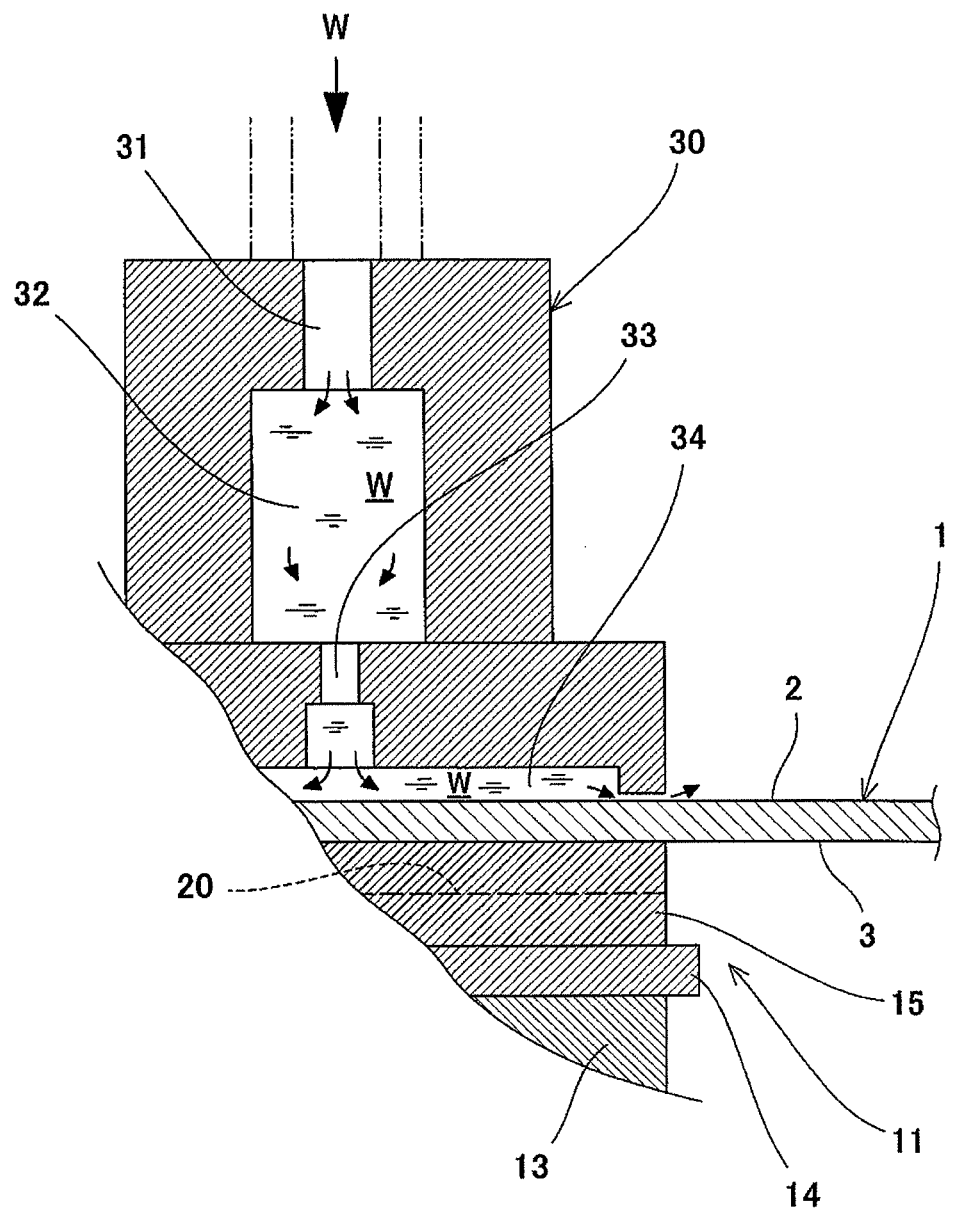
FIG. 3 is an enlarged view showing a pattern surface support water guide portion shown in FIG. 1.

As shown in FIG. 3, the pattern surface supporting water guide 30 includes, at its upper portion, a water supply opening 31 through which the water W having predetermined pressure is supplied. A water storage portion 32 having a predetermined volume is formed under the water supply opening 31. A pressure storing portion 34 to which the water is supplied through a supply hole 33 configured to increase in diameter at a portion thereof is formed under the water storage portion 32. The pressure storing portion 34 is configured such that the water leaks through a small space between the pattern surface supporting water guide 30 and the upper surface of the glass plate 1. The volume of the pressure storing portion 34 is calculated such that predetermined water pressure (fluid pressure) acts on the upper surface of the glass plate 1 by the water stored in the pressure storing portion 34.

As shown in FIG. 2, a plurality of pattern surface supporting water guides 30 are arranged at predetermined intervals in the conveying direction of the glass plate 1, and the interval between the pattern surface supporting water guides 30 is shown by chain double-dashed lines in FIG. 2. By providing the pattern surface supporting water guides 30 at the predetermined intervals, it is possible to maintain a state where the glass plate 1 having a limited length in the conveying direction is pressed against the belt portion 11 by the plurality of pattern surface supporting water guides 30.

The glass plate 1 is pressed against the rubber plate 15 of the belt portion 11 by water pressure generated by the water W supplied to the pattern surface supporting water guide 30, the water pressure corresponding to the area of the pressure storing portion 34. A reaction force of the pressing force received by the rubber plate 15 is received by the belt receiving portion 13. The pressing force applied to the glass plate 1 is adjusted by adjusting the water pressure. By pressing the glass plate 1 against the belt portion 11 by the water pressure as above, the glass plate 1 moves together with the belt portion 11 by a frictional force between the glass plate 1 and the rubber plate 15, the frictional force being proportional to the water pressure.

Therefore, the glass plate 1 is supported by the pattern surface supporting water guide 30 and the belt portion 11 so as to be sandwiched therebetween in the vertical direction such that the pattern surface 2 is in a non-contact state, and the glass plate 1 is moved integrally with the belt portion 11.

The configuration of sandwiching the glass plate 1 by the belt portion 11 and the pattern surface supporting water guide 30 in the vertical direction to convey the glass plate 1 is the transfer mechanism 40 for the glass plate 1, and the device configured to convey the glass plate 1 using the transfer mechanism 40 is the conveying device 10.

In the example shown in FIG. 1, a beveling apparatus 45 is configured to include the conveying device 10 and a beveling function. The beveling apparatus 45 includes beveling devices 50 configured to grind and polish the width-direction end edges 5 of the glass plate 1 transferred such that the pattern surface 2 of the glass plate 1 is in a non-contact state. In the present embodiment, the beveling devices 50 are arranged so as to be opposed to each other such that two opposed sides of the glass plate 1 are grinded and polished at the same time.

The beveling device 50 is configured such that a cylindrical grinding stone 52 (grinding stone portion) is provided under a driving machine (motor) 51. The grinding stone 52 is configured such that a plurality of round-beveling grinding stones 53 are lined up in the vertical direction. In the present embodiment, five round-beveling grinding stones 53 are provided. Used as the round-beveling grinding stones 53 are abrasive grains each having a predetermined particle size appropriate for the beveling of the glass plate 1. To bevel the end edge of the glass plate 1 such that the end edge has a semicircular shape, that is, a thickness middle portion of the end edge projects, the round-beveling grinding stone 53 has a cross section having a concave portion corresponding to the beveled shape of the glass plate 1. The shape of the round-beveling grinding stone 53 is not limited.

Regarding the round-beveling grinding stones 53, each of the concave portions lined up is an independent grinding stone. The concave portion is caused to contact the end edge of the glass plate 1 while rotating the entire grinding stone by the driving machine 51. With this, the end edge of the glass plate 1 is grinded by the concave portion to become the round shape. According to the grinding stone 52, even if a part of round-beveling grinding stones 53 are worn away, the other round-beveling grinding stones 53 can perform the grinding operation.

According to the beveling apparatus 45 of Embodiment 1 described above, the conveying device 10 supports the width-direction middle portion of the glass plate 1 on the rubber plate 15 of the belt portion 11 by the water pressure from the pattern surface supporting water guide 30 such that the glass plate 1 does not contact the pattern surface supporting water guide 30, and the width-direction both end portions of the glass plate 1 are supported in the non-contact manner by the width-direction both end portion water guides 25 and 27 and the width-direction intermediate portion water guides 26. Therefore, the glass plate 1 can be accurately conveyed by the belt portion 11 while maintaining the high quality of the pattern surface 2 of the glass plate 1.

In the case of the beveling apparatus 45 configured to include the conveying device 10 and the beveling function, the upper and lower surfaces of the width-direction both end portions of the glass plate 1 are supported by the width-direction both end portion water guides 25 and 27. Therefore, even if cutting powder of the grinding stones 52 provided on both sides scatters on the surface of the glass plate 1 by a centrifugal force, the cutting powder is washed away by the water. Thus, the cutting powder can be prevented from adhering to the surface of the glass plate 1.

Therefore, the glass plate 1 can be conveyed while maintaining the high quality of the surface of the glass plate 1, and the end edges of the glass plate 1 can be beveled. Therefore, the yield and the productivity can be improved.

Figure 4:
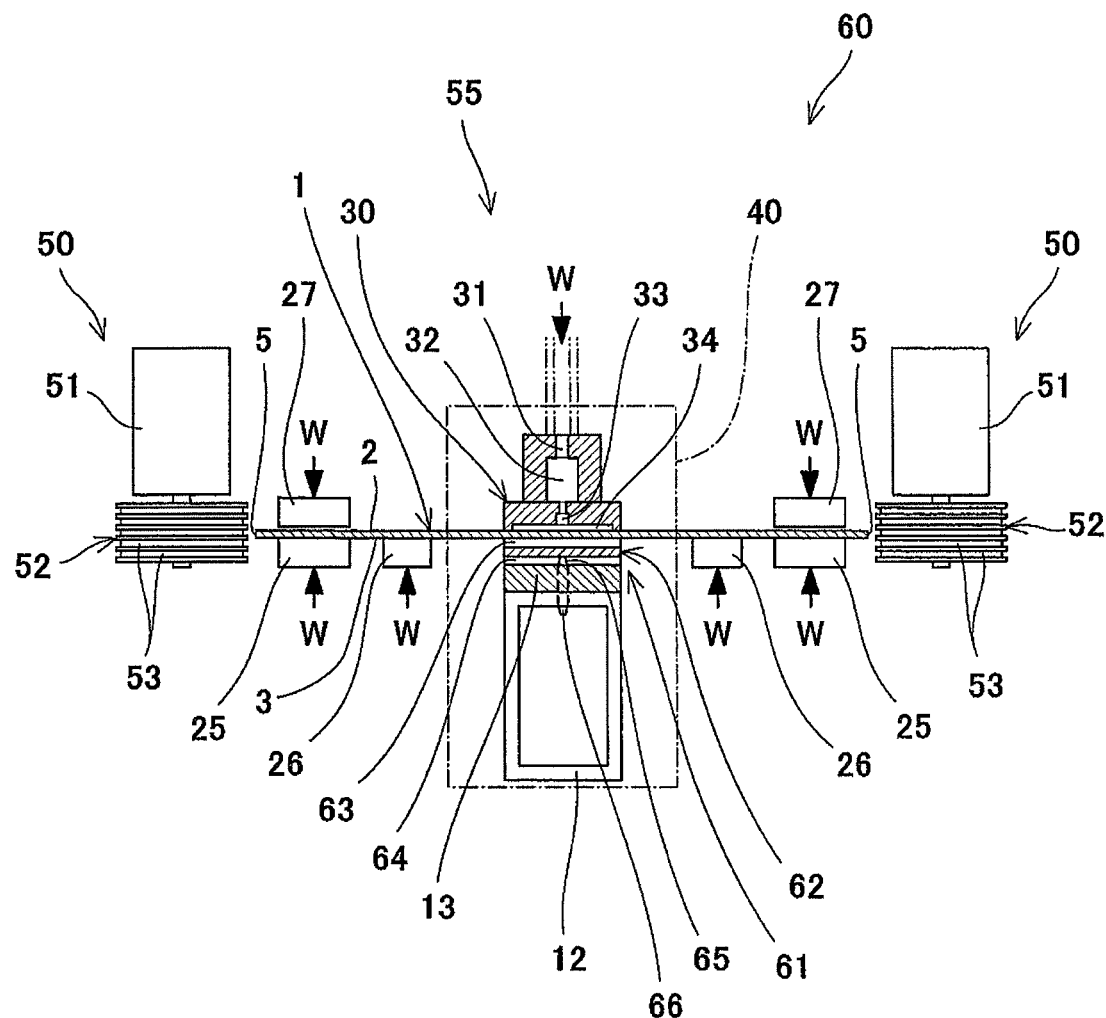
FIG. 4 is a cross-sectional view showing the beveling apparatus according to Embodiment 2 of the present invention, the cross-sectional view being perpendicular to the conveying direction, the beveling apparatus including the conveying device.

FIG. 4 shows a beveling apparatus 60 of Embodiment 2 that is different from Embodiment 1 regarding the belt portion 11. In the conveying device 10 of Embodiment 1, the metal belt 14 is used in the belt portion 11. In a conveying device 55 of Embodiment 2, a special timing belt 62 is adopted in a belt portion 61 contacting the lower surface of the glass plate 1. The same reference signs are used for the same components as in Embodiment 1, and a repetition of the same explanation is avoided.

Figure 5:
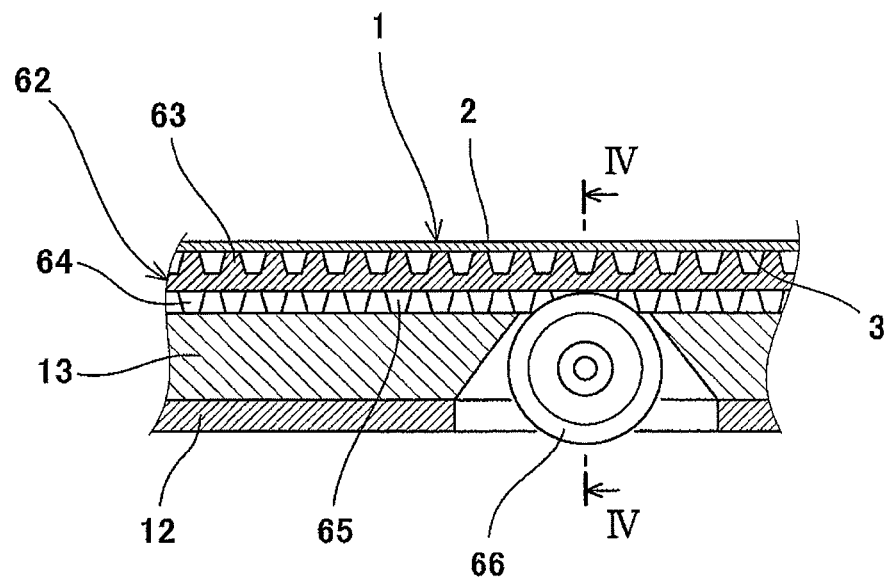
FIG. 5 is a middle portion cross-sectional view showing the belt portion shown in FIG. 4 in the conveying direction.

As shown in FIG. 5, the timing belt 62 is a timing belt configured such that tooth portions are formed on both an outer surface and inner surface thereof. Outer surface tooth portions 63 are formed in order that in a state where the outer surface tooth portions 63 contact the glass plate 1, the water between the timing belt 62 and the glass plate 1 is discharged through portions each between the adjacent tooth portions 63, so that the frictional resistance between the timing belt 62 and the glass plate 1 is maintained. Inner surface tooth portions 64 mesh with drive pulleys (not shown) at an end portion of the timing belt 62 to accurately transfer the timing belt 62.

Figure 6:
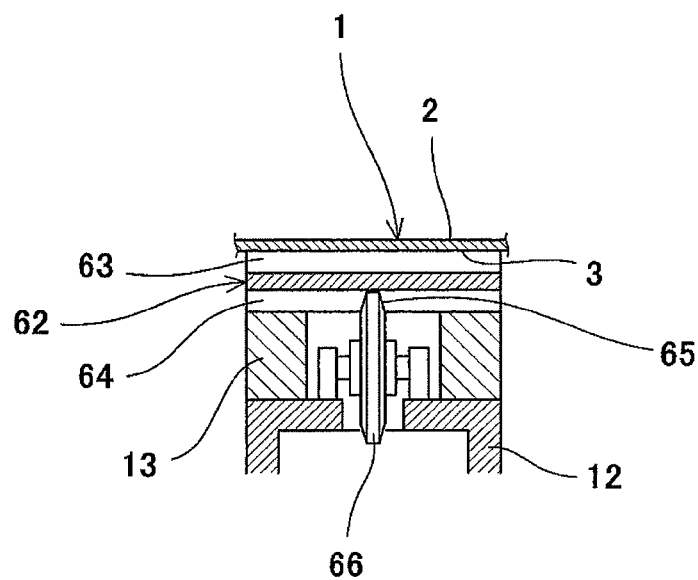
FIG. 6 is a cross-sectional view taken along line VI-VI of FIG. 5.

As shown in FIG. 6, a cut groove that is a guide portion 65 is formed at the inner surface tooth portions 64 of the timing belt 62 so as to extend in a longitudinal direction of the width-direction middle portion. A guide pulley 66 rotatably supported by a support member 67 provided at the frame 12 is provided along the guide portion 65. The guide pulley 66 is rotatably supported by the frame 12. The conveying-direction straightness deviation of the timing belt 62 is secured in such a manner that the timing belt 62 is transferred in the conveying direction in a state where the guide portion 65 of the timing belt 62 is provided along the guide pulley 66. By maintaining the conveying-direction straightness deviation of the timing belt 62, the conveying-direction straightness deviation of the glass plate 1 transferred integrally with the timing belt 62 is maintained.

The present embodiment has explained, as an example, the special timing belt 62 configured such that the tooth portions 63 and 64 are respectively formed on both the outer surface and inner surface thereof. However, the other belt may be used as long as it has the same configuration as above.

According to the beveling apparatus 60 of Embodiment 2 described above, the conveying device 55 supports the width-direction middle portion of the glass plate 1 on the timing belt 62 of the belt portion 61 by the water pressure from the pattern surface supporting water guide 30 such that the glass plate 1 does not contact the pattern surface supporting water guide 30, and the width-direction both end portions of the glass plate 1 are supported in the non-contact manner by the width-direction both end portion water guides 25 and 27 and the width-direction intermediate portion water guides 26. Therefore, the glass plate 1 can be accurately conveyed by the belt portion 61 while maintaining the high quality of the pattern surface 2 of the glass plate 1.

In the present embodiment, in the case of the beveling apparatus 60 configured to include the conveying device 55 and the beveling function, the upper and lower surfaces of the width-direction both end portions of the glass plate 1 are supported by the width-direction both end portion water guides 25 and 27. Therefore, according to the beveling apparatus 60 including the conveying device 55, even if cutting powder of the grinding stones 52 provided on both sides scatters on the surface of the glass plate 1 by the centrifugal force, the cutting powder is washed away by the water. Thus, the cutting powder can be prevented from adhering to the surface of the glass plate 1.

Therefore, in the present embodiment, the glass plate 1 can be conveyed while maintaining the high quality of the surface of the glass plate 1, and the end edges of the glass plate 1 can be beveled. Therefore, the yield and the productivity can be improved.

Figure 7A:
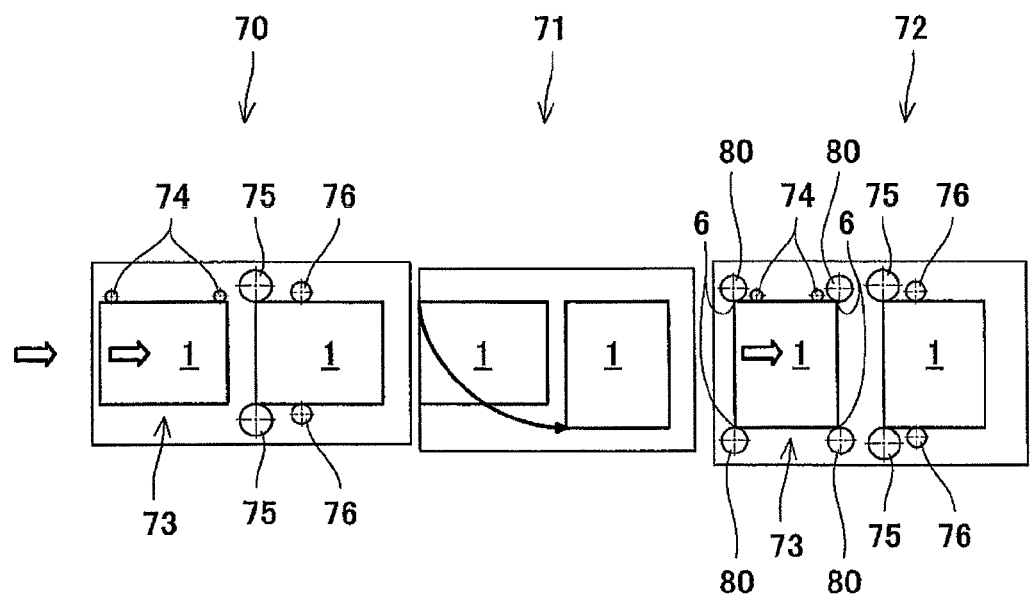
FIG. 7A is a plan view schematically showing a first arrangement example of the beveling apparatus according to the present invention.
Figure 7B:
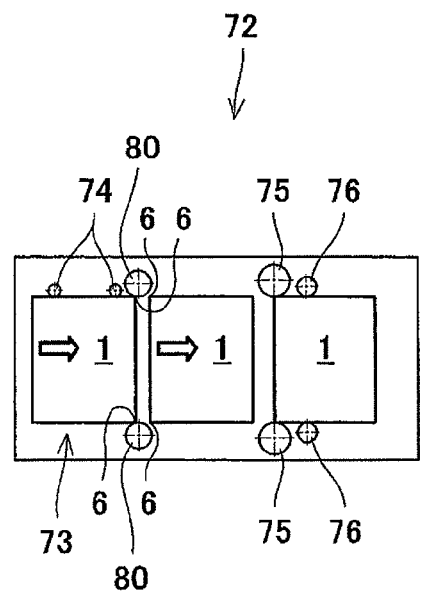
FIG. 7B is a plan view showing a different example of a corner beveling device in the beveling apparatus.
Figure 8:
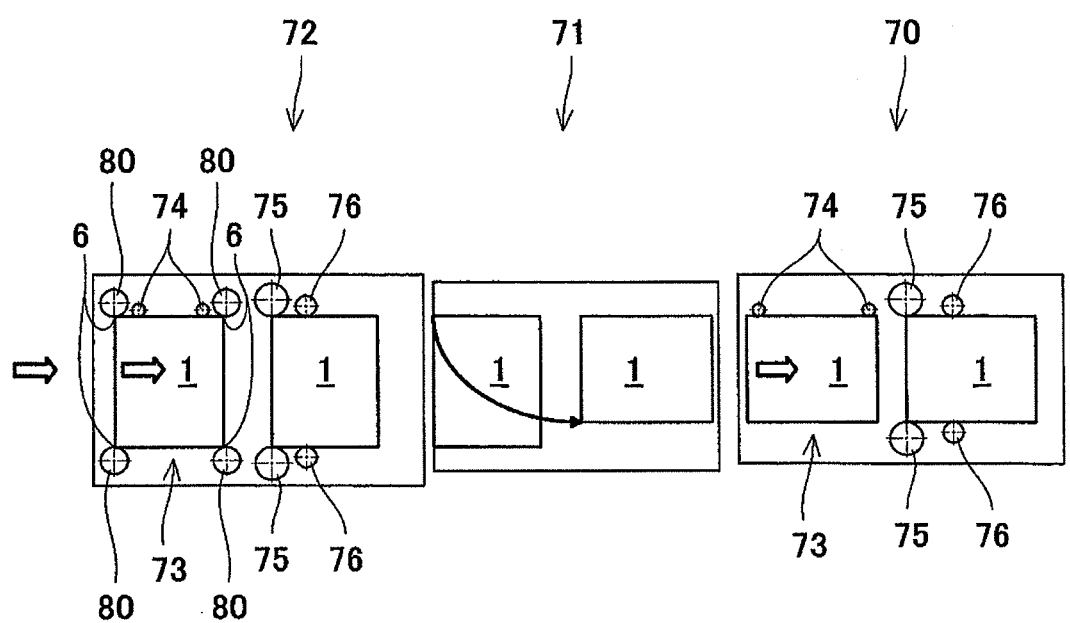
FIG. 8 is a plan view schematically showing a second arrangement example of the beveling apparatus according to the present invention.

FIGS. 7A, 7B, and 8 are diagrams showing arrangement examples of the beveling apparatuses 45 and 60. FIG. 7A shows an example in which: a long-side beveling apparatus 70 configured to bevel long sides of the rectangle glass plate 1 is arranged on an upstream side; and a rotating machine 71 configured to rotate the glass plate 1 by 90 degrees in a horizontal plane and a short-side beveling apparatus 72 configured to bevel short sides of the glass plate 1 are arranged in this order so as to be located downstream of the long-side beveling apparatus 70. In FIG. 7A, the left side is a carry-in side, and the right side is a carry-out side. The glass plate 1 is conveyed from the left side to the right side. Although each of these beveling apparatuses 70 and 72 has the same configuration as the above-described beveling apparatus 45 or 60, different reference signs are used for major components in the following explanation.

In the case of the configuration shown in FIG. 7A, the position of the glass plate 1 having been carried in the long-side beveling apparatus 70 is adjusted by base rollers 74 of an alignment device 73 based on one side extending in a transferring direction. While the aligned glass plate 1 is being transferred in the conveying direction, two long sides of the glass plate 1 are beveled in a round shape by grinding stones 75 (round-beveling grinding stones), and then, polished by polishing stones 76.

The glass plate 1 having the long sides beveled by the long-side beveling apparatus 70 is transferred to the rotating machine 71 and rotated by 90 degrees in a horizontal plane by the rotating machine 71. The glass plate 1 having been rotated by 90 degrees by the rotating machine 71 is conveyed to the short-side beveling apparatus 72.

In the configuration shown in FIG. 7A, the position of the glass plate 1 having been carried in the short-side beveling apparatus 72 is adjusted by the base rollers 74 of the alignment device 73 based on one side extending in the transferring direction, and four corner portions 6 of the glass plate 1 are beveled by corner beveling devices 80. While the glass plate 1 having been aligned and having the four corner portions 6 beveled by the corner beveling device 80 is being conveyed by the short-side beveling apparatus 72, two short sides of the glass plate 1 are beveled in a round shape by the grinding stones 75, and then, polished by the polishing stones 76. In the configuration shown in FIG. 7A, four corner beveling devices 80 are provided. However, as shown in FIG. 7B, the short-side beveling apparatus 72 may be configured such that: two corner beveling devices 80 are provided; two corner portions 6 at a front end in the conveying direction are beveled; the glass plate 1 is transferred; and two corner portions 6 at a rear end are beveled.

Then, the glass plate 1 having the grinded and polished periphery is carried out to a subsequent step. According to this configuration, the four corner portions 6 are beveled in the short-side beveling apparatus 72 whose conveyance distance is short. Therefore, a time required to bevel the corner portions and two short sides and a time required to bevel two long sides can be set to be equal to each other. Therefore, the operation of beveling the entire periphery of the glass plate 1 while conveying the glass plate 1 can be continuously performed by the long-side beveling apparatus 70 and the short-side beveling apparatus 72. Thus, the operation of beveling the glass plate 1 can be performed efficiently.

FIG. 8 shows a case where the positions of the long-side beveling apparatus 70 and the short-side beveling apparatus 72 are opposite to those shown in FIG. 7A in a front-rear direction. Since the configurations are the same as above, the same reference signs are used for the same components in the following explanation.

As shown in FIG. 8, in the case of this configuration, the position of the glass plate 1 having been carried in the short-side beveling apparatus 72 is adjusted by the base rollers 74 of the alignment device 73 based on one side extending in the transferring direction, and the four corner portions 6 of the glass plate 1 are beveled by the corner beveling devices 80. While the glass plate 1 having been aligned and having the four corner portions 6 beveled by the corner beveling devices 80 is being conveyed by the short-side beveling apparatus 72, two short sides of the glass plate 1 are beveled in a round shape by the grinding stones 75, and then, polished by the polishing stones 76.

The glass plate 1 having the short sides beveled by the short-side beveling apparatus 72 is transferred to the rotating machine 71 and rotated by 90 degrees in a horizontal plane by the rotating machine 71. The glass plate 1 having been rotated by 90 degrees by the rotating machine 71 is conveyed to the long-side beveling apparatus 70.

The position of the glass plate 1 having been carried in the long-side beveling apparatus 70 is adjusted by the base rollers 74 of the alignment device 73 based on one side extending in the transferring direction. While the aligned glass plate 1 is being transferred in the conveying direction, two long sides of the glass plate 1 are beveled in a round shape by the grinding stones 75, and then, polished by the polishing stones 76.

Then, the glass plate 1 having the grinded and polished periphery is carried out to a subsequent step. According to this configuration, as described above, a time required to bevel the corner portions and two short sides and a time required to bevel two long sides can be set to be equal to each other. Therefore, the operation of beveling the entire periphery of the glass plate 1 while conveying the glass plate 1 can be continuously performed. Thus, the operation of beveling the glass plate 1 can be performed efficiently.

The configurations of the beveling apparatuses 70 and 72 shown in FIG. 7A or 8 are determined depending on the direction of the glass plate 1 carried in from an upstream step. Then, since the four-side end edges 5 and four corner portions 6 of the glass plate 1 carried out from the beveling apparatus 70 or 72 are being entirely grinded and polished, the glass plate 1 having high accuracy of finishing is carried out to a subsequent step.

Figure 9:
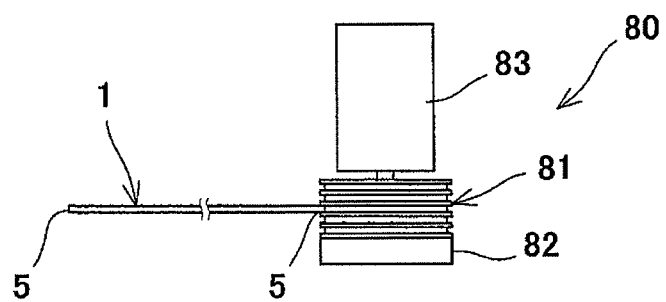
FIG. 9 is a cross-sectional view showing grinding by another example of the beveling device shown in FIGS. 7 and 8.
Figure 10:
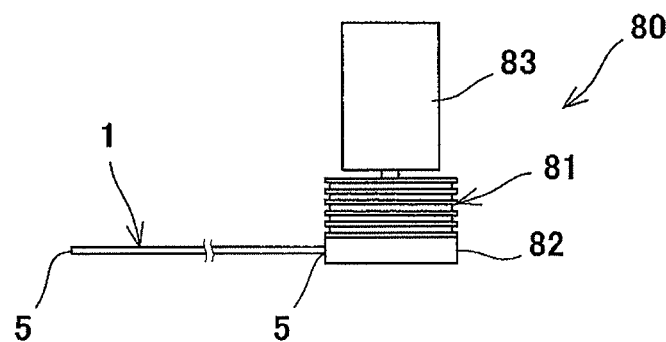
FIG. 10 is a cross-sectional view showing polishing by the beveling device shown in FIG. 9.

FIGS. 9 and 10 are configuration examples of the corner beveling device 80 shown in FIGS. 7A, 7B, and 8. The corner beveling device 80 coaxially includes a corner beveling stone 81 configured to grind the corner portion 6 in a liner or curved shape and a polishing stone 82 configured to polish the grinded surface, and the corner beveling stone 81 and the polishing stone 82 are driven by a driving machine 83 (motor or the like). In the example shown in FIGS. 9 and 10, the polishing stone 82 is attached to a lower side of the grinding stone 81. This configuration further includes an arrangement changing mechanism configured to change the positions of the grinding stone 81 and the polishing stone 82 in an axial direction. As the arrangement changing mechanism, for example, a mechanism configured to cause the entire corner beveling device 80 to move in the axial direction is adopted.

With this, after the glass plate 1 is grinded by the grinding stone 81 as shown in FIG. 9, the corner beveling device 80 can be moved (moved upward) in the axial direction such that the polishing stone 82 is located at the position of the glass plate 1 as shown in FIG. 10, and then, the glass plate 1 can be polished by the same trajectory. Thus, the grinding operation and the polishing operation can be continuously, quickly performed. In addition, by performing the polishing operation of the corner portions, the beveled corner portions of the glass plate 1 can be polished and finished with a high degree of accuracy. Thus, the product quality can be improved.

As above, according to the beveling apparatus 45 or 60, the glass plate 1 can be conveyed by the conveying device 10 or 55 while preventing the pattern surface 2 of the glass plate 1 from contacting any structure. Therefore, scratches can be surely prevented from being made on the pattern surface 2 of the glass plate 1.

Since the four-side end edges 5 and four corner portions 6 of the glass plate 1 can be quickly beveled by grinding and polishing, the glass plate 1 of the entire periphery having high accuracy of finishing of beveling can be produced. In addition, by realizing the high quality of the finishing of the beveling of the periphery, the glass plate 1 can be prevented from breaking and the like in a subsequent step. Thus, the yield and the productivity can be improved.

Further, according to the beveling apparatus 45 or 60 described above, the glass plates 1 can be continuously transferred, so that a cycle time required to perform the beveling operation of the glass plate 1 can be shortened.

The above embodiments have explained examples in which the conveying device 10 or 55 is applied to the beveling apparatus 45 or 60. However, the conveying device 10 or 55 is applicable to the other apparatus as long as the apparatus is configured to convey the glass plate 1 in a horizontal state, and the above embodiments are not limited to the beveling apparatuses 45 and 60.

The above embodiments have explained examples in which the transfer mechanism 40 is provided only at the width-direction middle portion of the glass plate 1. However, a plurality of transfer mechanisms 40 may be provided in the width direction, and the above embodiments are not limited to the above configuration.

Further, the above embodiments have explained examples in which the water guide is used as the fluid guide. However, an air guide may be used as the fluid guide, and the above embodiments are not limited to the above configuration.

Further, each of the above embodiments is just one example. Various modifications may be made within the spirit of the present invention, and the present invention is not limited to the above-described embodiments.

INDUSTRIAL APPLICABILITY

The glass plate conveying device according to the present invention can be utilized in, for example, a beveling apparatus configured to bevel a glass plate while transferring the glass plate, and a glass plate rotating device.

REFERENCE SIGNS LIST

1 glass plate
2 pattern surface
3 non-pattern surface
5 end edge
6 corner portion
10 conveying device
11 belt portion
13 belt receiving portion
14 metal belt
15 rubber plate
16 side roller (base guide portion)
17 side roller (guide portion)
19 spring
20 groove
25 width-direction both end portion water guide (fluid guide)
26 width-direction intermediate portion water guide
27 width-direction both end portion water guide (fluid guide)
30 pattern surface supporting water guide (fluid guide)
32 water storage portion
33 supply hole
34 pressure storing portion
40 transfer mechanism
45 beveling apparatus
50 beveling device
51 driving machine
52 grinding stone
53 round-beveling grinding stone
55 conveying device
60 beveling apparatus
61 belt portion
62 timing belt
63 outer surface tooth portion
64 inner surface tooth portion
65 guide portion
66 guide pulley
70 long side beveling apparatus
71 rotating machine
72 short side beveling apparatus
73 alignment device
74 base roller
75 grinding stone (round-beveling grinding stone)
76 polishing stone
80 corner beveling device
81 grinding stone (corner beveling stone)
82 polishing stone (corner beveling stone)
W water (fluid)

The invention claimed is:

1. A glass plate conveying device configured to transfer a glass plate in a horizontal state,
the glass plate conveying device comprising a transfer mechanism including:
a belt portion configured to support at a middle portion of a non-pattern surface of the glass plate and transfer the glass plate in a conveying direction;
a fluid guide arranged at a position opposed to the belt portion and configured to apply predetermined fluid pressure to a pattern surface of the glass plate, wherein:
the fluid guide includes a plurality of pattern surface supporting fluid guides provided at predetermined intervals in the conveying direction of the glass plate so as to be opposed to the belt portion,
each of the plurality of pattern surface supporting fluid guides includes a pressure storing portion configured to store fluid in a state where the fluid leaks through a space between the pattern surface supporting fluid guide and the pattern surface of the glass plate, a volume of the pressure storing portion being set such that predetermined fluid pressure acts on the pattern surface of the glass plate, the plurality of pattern surface supporting fluid guides being arranged so as to maintain a state where the glass plate is pressed against the belt portion by pressure storing portions of two or more pattern surface supporting fluid guides provided at predetermined intervals in the conveying direction of the glass plate, and the transfer mechanism is configured such that the glass plate is pressed against the belt portion by fluid pressure of the fluid guide, and the glass plate is sandwiched between the fluid guide and the belt portion in a state where the pattern surface of the glass plate is in a non-contact state;

width-direction end portion fluid guides comprising (i) a non-pattern surface fluid guide configured to support a non-pattern surface of the glass plate by applying fluid pressure thereto and (ii) a pattern surface fluid guide that is arranged at a position opposed to the non-pattern surface fluid guide and that is configured to apply fluid pressure to the pattern surface of the glass plate, wherein each of the width-direction end portion fluid guide is further arranged at an end portion of a width of the glass plate; and intermediated fluid guide configured to apply fluid pressure to the non-pattern surface of the glass plate, the intermediate fluid guide being arranged at an intermediate portion of the glass plate between the belt portion and the width-direction end portion fluid guides.

2. The glass plate conveying device according to claim 1, wherein:
the transfer mechanism is provided at a width-direction middle portion of the glass plate; and
fluid guides each configured to form a fluid layer between the surface of the glass plate and the fluid guide and support the glass plate in a non-contact manner are respectively arranged at both end portions of the glass plate.

3. The glass plate conveying device according to claim 1, wherein the glass plate is conveyed in a state where the pattern surface of the glass plate faces upward.

4. A glass plate beveling apparatus comprising:
the conveying device according to claim 1;
a beveling device configured to grind and polish an end edge of the glass plate conveyed by the conveying device; and
a guide portion configured to guide the belt portion in the conveying direction.

5. The glass plate beveling apparatus according to claim 4, wherein the beveling device includes grinding stone portions respectively provided at both transferring-direction side portions of the glass plate so as to be opposed to each other.

6. The glass plate beveling apparatus according to claim 4, wherein the beveling device includes a corner beveling device configured to grind and polish a corner portion of the glass plate.

7. The glass plate beveling apparatus according to claim 6, wherein:
the corner beveling device includes a grinding stone portion including a grinding stone and a polishing stone; and
the grinding stone portion includes an arrangement changing mechanism configured to cause the grinding stone or the polishing stone to be located at the end edge of the glass plate.

8. The glass plate beveling apparatus according to claim 4, wherein:
two beveling apparatuses are arranged in the conveying direction of the glass plate; and
a rotating machine configured to rotate the glass plate by 90 degrees in a horizontal plane is arranged between the two beveling apparatuses.

9. The glass plate beveling apparatus according to claim 8, comprising:
a long side beveling apparatus; and
a short side beveling apparatus, wherein:
the long side beveling apparatus includes a grinding stone portion including a round-beveling grinding stone and a polishing stone; and
the short side beveling apparatus includes a grinding stone portion including a round-beveling grinding stone, a polishing stone, and a corner beveling stone.

10. The glass plate conveying device according to claim 2, wherein the glass plate is conveyed in a state where the pattern surface of the glass plate faces upward.

11. A glass plate beveling apparatus comprising:
the conveying device according to claim 2;
a beveling device configured to grind and polish an end edge of the glass plate conveyed by the conveying device; and
a guide portion configured to guide the belt portion in the conveying direction.

12. A glass plate beveling apparatus comprising:
the conveying device according to claim 3;
a beveling device configured to grind and polish an end edge of the glass plate conveyed by the conveying device; and
a guide portion configured to guide the belt portion in the conveying direction.

13. The glass plate beveling apparatus according to claim 5, wherein the beveling device includes a corner beveling device configured to grind and polish a corner portion of the glass plate.

14. The glass plate beveling apparatus according to claim 5, wherein:
two beveling apparatuses are arranged in the conveying direction of the glass plate; and
a rotating machine configured to rotate the glass plate by 90 degrees in a horizontal plane is arranged between the two beveling apparatuses.

15. The glass plate beveling apparatus according to claim 6, wherein:
two beveling apparatuses are arranged in the conveying direction of the glass plate; and
a rotating machine configured to rotate the glass plate by 90 degrees in a horizontal plane is arranged between the two beveling apparatuses.

16. The glass plate beveling apparatus according to claim 7, wherein:
two beveling apparatuses are arranged in the conveying direction of the glass plate; and
a rotating machine configured to rotate the glass plate by 90 degrees in a horizontal plane is arranged between the two beveling apparatuses.

17. The glass plate conveying device according to claim 1, wherein the width-direction end portion fluid guides are arranged at both end portions of the width of the glass plate.

18. The glass plate conveying device according to claim 1, wherein the width-direction end portion fluid guides and the intermediate fluid guides support the glass plate in a non-contact manner.

19. A glass plate conveying device configured to transfer a glass plate in a horizontal state,
the glass plate conveying device comprising a transfer mechanism including:

a belt portion configured to support at a middle portion of a non-pattern surface of the glass plate and transfer the glass plate in a conveying direction; and a fluid guide arranged at a position opposed to the belt portion and configured to apply predetermined fluid pressure to a pattern surface of the glass plate, wherein:

the fluid guide includes a plurality of pattern surface supporting fluid guides provided at predetermined intervals in the conveying direction of the glass plate so as to be opposed to the belt portion;

each of the plurality of pattern surface supporting fluid guides comprises a fluid supply opening at an top portion of the fluid guide and a fluid storage portion having a predetermined volume formed under the fluid supply opening;

a pressure storing portion to which a fluid is supplied through a supply hole formed under the fluid storage portion that is configured to increase in diameter at a portion thereof; the pressure storage portion is configured to store fluid in a state where the fluid leaks through a space between the pattern surface supporting fluid guide and the pattern surface of the glass plate, a volume of the pressure storing portion being set such that predetermined fluid pressure acts on the pattern surface of the glass plate, the plurality of pattern surface supporting fluid guides being arranged so as to maintain a state where the glass plate is pressed against the belt portion by pressure storing portions of two or more pattern surface supporting fluid guides provided at predetermined intervals in the conveying direction of the glass plate, and the transfer mechanism is configured such that the glass plate is pressed against the belt portion by fluid pressure of the fluid guide, and the glass plate is sandwiched between the fluid guide and the belt portion is a state where the pattern surface of the glass plate is in a non-contact state;

width-direction end portion fluid guides comprising (i) a non-pattern surface fluid guide configured to support a non-pattern surface of the glass plate by applying fluid pressure thereto and (ii) a pattern surface fluid guide that is arranged at a position opposed to the non-pattern surface fluid guide and that is configured to apply fluid pressure to the pattern surface of the glass plate, wherein each of the width-direction end portion fluid guides is further arranged at an end portion of a width of the glass plate; and intermediate fluid guides configured to apply fluid pressure to the non-pattern surface of the glass plate, the intermediate fluid guides being arranged at an intermediate portion of the glass plate between the belt portion and the width-direction end portion fluid guides.

* * * * *